US012707784B2

(12) United States Patent
Park et al.

(10) Patent No.: US 12,707,784 B2
(45) Date of Patent: Aug. 11, 2026

(54) DISPLAY MODULE INCLUDING PLURALITY OF LIGHT-EMITTING DIODES AND PLURALITY OF PIXEL CIRCUITS

(71) Applicant: SAMSUNG ELECTRONICS CO., LTD., Suwon-si (KR)

(72) Inventors: Wonkeun Park, Suwon-si (KR); Donghwan Kim, Suwon-si (KR); Donghun Lee, Suwon-si (KR); Youngki Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 18/378,422

(22) Filed: Oct. 10, 2023

(65) Prior Publication Data

US 2024/0079540 A1 Mar. 7, 2024

Related U.S. Application Data

(63) Continuation of application No. PCT/KR2023/013136, filed on Sep. 4, 2023.

(30) Foreign Application Priority Data

Sep. 7, 2022 (KR) ........................ 10-2022-0113532

(51) Int. Cl.
*H10H 20/857* (2025.01)
*H10H 20/831* (2025.01)
*H10H 29/14* (2025.01)

(52) U.S. Cl.
CPC ........ *H10H 20/857* (2025.01); *H10H 20/831* (2025.01); *H10H 29/142* (2025.01)

(58) Field of Classification Search
CPC ... H01L 25/167; H01L 25/0753; H10H 29/10; H10H 29/142; G09G 3/3233
USPC ............................................... 257/79; 438/22
See application file for complete search history.

(56) References Cited

U.S. PATENT DOCUMENTS

| | | | |
|---|---|---|---|
| 8,619,008 B2 | 12/2013 | Cok | |
| 10,650,730 B2 | 5/2020 | Son et al. | |
| 2010/0207852 A1 | 8/2010 | Cok | |
| 2017/0186372 A1* | 6/2017 | Yanase | G09G 3/3233 |
| 2020/0066693 A1* | 2/2020 | Kim | H05K 1/02 |
| 2020/0243600 A1 | 7/2020 | Tzeng et al. | |

(Continued)

FOREIGN PATENT DOCUMENTS

| | | |
|---|---|---|
| CN | 104701352 B | 6/2017 |
| EP | 3 675 106 A1 | 7/2020 |

(Continued)

OTHER PUBLICATIONS

International Search Report (PCT/ISA/210) issued by the International Searching Authority on Dec. 12, 2023 in corresponding International Application No. PCT/KR2023/013136.

(Continued)

*Primary Examiner* — Didarul A Mazumder
(74) *Attorney, Agent, or Firm* — Sughrue Mion, PLLC

(57) ABSTRACT

A display module includes a substrate, a first pixel circuit, a first light emitting element, a second pixel circuit and a second light emitting element. The first pixel circuit is configured to control the first light emitting element. The first pixel circuit is located inwardly from an edge of the substrate with respect to the first light emitting element.

17 Claims, 7 Drawing Sheets

(56) References Cited

U.S. PATENT DOCUMENTS

| | | | | |
|---|---|---|---|---|
| 2021/0043616 | A1* | 2/2021 | Jung | H10H 20/01 |
| 2021/0134768 | A1 | 5/2021 | Park et al. | |
| 2021/0151650 | A1 | 5/2021 | Li et al. | |
| 2022/0005994 | A1 | 1/2022 | Morita et al. | |
| 2022/0172672 | A1 | 6/2022 | Tetsuya et al. | |
| 2022/0270544 | A1 | 8/2022 | Park et al. | |
| 2022/0415873 | A1 | 12/2022 | Chung et al. | |
| 2023/0030891 | A1* | 2/2023 | Du | G09G 3/3233 |
| 2023/0125557 | A1 | 4/2023 | Lee et al. | |

FOREIGN PATENT DOCUMENTS

| | | | |
|---|---|---|---|
| JP | 2020-531914 | A | 11/2020 |
| KR | 10-1596386 | B1 | 2/2016 |
| KR | 10-1641168 | B1 | 7/2016 |
| KR | 10-2017-0101056 | A | 9/2017 |
| KR | 10-2019-0002178 | A | 1/2019 |
| KR | 10-2020-0050614 | A | 5/2020 |
| KR | 10-2114406 | B1 | 6/2020 |
| KR | 10-2022-0014743 | A | 2/2022 |
| KR | 10-2022-0064004 | A | 5/2022 |
| KR | 10-2022-0120402 | A | 8/2022 |
| WO | 2013/074372 | A1 | 5/2013 |

OTHER PUBLICATIONS

Written Opinion (PCT/ISA/237) issued by the International Searching Authority on Dec. 12, 2023 in corresponding International Application No. PCT/KR2023/013136.

Communication dated Dec. 2, 2025 issued by the Korean Ministry of Intellectual Property in Korean Patent Application No. 10-2022-0113532.

Extended European Search Report dated Apr. 21, 2026, issued by the European Patent Office in European Application No. 23863428.1.

Communication issued Jul. 6, 2026 by the Korean Ministry of Intellectual Property for KR Patent Application No. 10-2022-0113532.

* cited by examiner

DISPLAY MODULE INCLUDING PLURALITY OF LIGHT-EMITTING DIODES AND PLURALITY OF PIXEL CIRCUITS

CROSS REFERENCE TO RELATED APPLICATIONS

The present application is a continuation of international application PCT/KR2023/013136 filed on Sep. 4, 2023 in the Korean Intellectual Property Office (KIPO), which claims benefit of priority to KR Patent Application No. 10-2022-0113532 filed on Sep. 7, 2022 in KIPO. The contents of the above applications are hereby incorporated by reference.

FIELD

The disclosure relates to a display module including a plurality of light emitting diodes and a plurality of pixel circuits driving the plurality of light emitting diodes.

BACKGROUND

A display panel includes a substrate on which a plurality of thin film transistors (TFTs) are provided and a plurality of light emitting diodes mounted on the substrate. The plurality of light emitting diodes may be inorganic light emitting diodes emitting light by themselves. The plurality of light emitting diodes express various colors as they operate in pixel or sub-pixel units. The operations of each pixel or sub-pixel are controlled by the plurality of TFTs. Each light emitting diode emits various colors, e.g., red, green, or blue colors.

SUMMARY

Provided herein is a display module including a substrate on which a plurality of substrate electrode pads are arranged and which includes a plurality of pixel circuits connected with the plurality of substrate electrode pads, wherein the plurality of pixel circuits includes a first pixel circuit and a second pixel circuit, and wherein the plurality of substrate electrode pads includes a first substrate electrode pad; and a plurality of light emitting elements connected to the plurality of substrate electrode pads, the plurality of light emitting elements including a first light emitting element, wherein the first light emitting element is electrically connected to the first substrate electrode pad and the first pixel circuit is configured to control the first light emitting element, wherein the first pixel circuit is closer to a first edge of the substrate than the second pixel circuit, and the first pixel circuit is further from the first edge of the substrate than is the first light emitting element.

In some embodiments, the substrate includes a plurality of data wirings that are respectively connected electrically to the first pixel circuit, and the plurality of data wirings are arranged to be further from the first edge of the substrate than the first light emitting element.

In some embodiments, the substrate is a quadrangle including the first edge, a second edge, a third edge and a fourth edge.

In some embodiments, the substrate includes the first edge and a second edge, wherein the second edge is opposite to the first edge, and the plurality of pixel circuits are arranged to be closer to the second edge than to the first light emitting element.

In some embodiments, the plurality of substrate electrode pads are respectively electrically connected to corresponding pixel circuits through a plurality of connection wirings.

In some embodiments, the substrate includes a plurality of layers, and the plurality of data wirings are and the plurality of connection wirings arranged on different layers of the plurality of layers.

In some embodiments, the plurality of light emitting elements are arranged uniformly over a surface of the substrate, wherein the surface extends in a first direction and a second direction perpendicular to the first direction, and wherein the second pixel circuit controls a second light emitting element.

In some embodiments, the first edge is susceptible to a physical shock during a manufacturing process, and the first pixel circuit being further from the first edge of the substrate than is the first light emitting element, is configured to reduce a damage due to the physical shock.

In some embodiments, the first light emitting element, the first pixel circuit, the second pixel circuit and the second light emitting element are located on the surface defined by the first direction and the second direction at a first location, a second location, a third location and the third location, respectively, wherein the first edge extends in the second direction, and wherein the first pixel circuit is located at the second location inwardly along the first direction from the first location.

In some embodiments, the display module includes a display driver integrated circuit (IC), wherein each layer of the plurality of layers extends in the first direction and the second direction, the plurality of layers are stacked in a third direction, the second pixel circuit and the second light emitting element are electrically connected to the display driver IC by a third instance of metal wirings stacked in the third direction and a third connection wiring, the first pixel circuit is electrically connected to the display driver IC by a first instance of metal wirings stacked in the third direction and a first connection wiring, and the first light emitting element is connected to the first pixel circuit by a third instance of metal wiring stacked in the third direction and a second connection wiring.

In some embodiments, the first connection wiring and the second connection wiring are not in the same layer of the plurality of layers.

In some embodiments, the first connection wiring and the third connection wiring are in the same layer of the plurality of layers.

In some embodiments, the number of layers is four.

In some embodiments, the first light emitting element includes three subpixels, wherein the three subpixels correspond respectively to the colors red, green and blue.

In some embodiments, the first light emitting element includes four subpixels, wherein the four subpixels correspond respectively to the colors red, green, blue and green.

DETAILED DESCRIPTION

Figure 1:
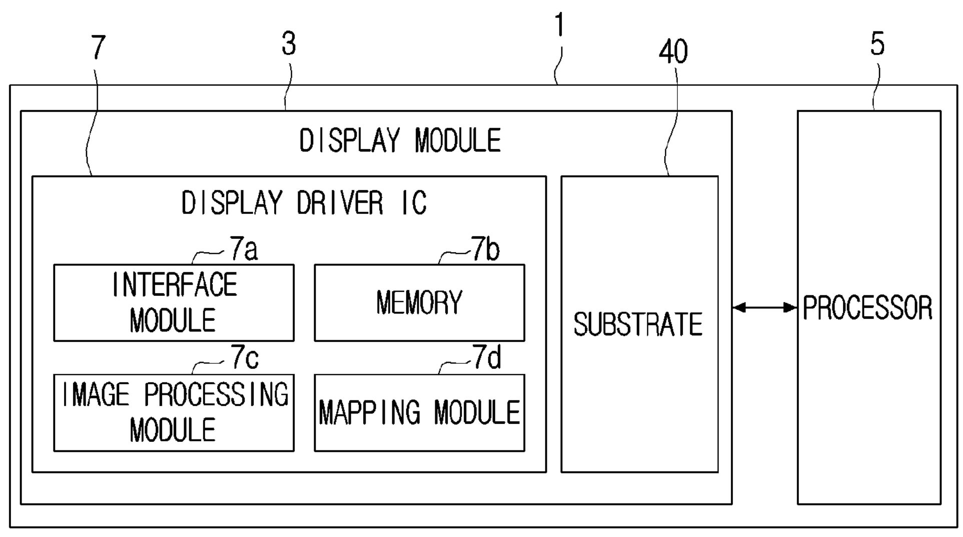
FIG. 1 is a block diagram illustrating a display device according to one or more embodiments of the disclosure.

Hereinafter, various embodiments will be described in more detail with reference to the accompanying drawings. The embodiments described in this specification may be modified in various ways. Also, specific embodiments may be illustrated in the drawings, and described in detail in the detailed description. However, specific embodiments disclosed in the accompanying drawings are just for making the various embodiments easily understood. Accordingly, the technical idea of the disclosure is not restricted by the specific embodiments disclosed in the accompanying drawings, and the embodiments should be understood as including all equivalents or alternatives included in the idea and the technical scope of the disclosure.

Also, in the disclosure, terms including ordinal numbers such as 'the first' and 'the second' may be used to describe various components, but these components are not limited by the aforementioned terms. The aforementioned terms are used only for the purpose of distinguishing one component from another component.

In addition, in the disclosure, terms such as "include" and "have" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof. Further, the description in the disclosure that an element is "coupled with/to" or "connected to" another element should be interpreted to mean that the one element may be directly coupled with/to or connected to the another element, but still another element may exist between the elements. In contrast, the description that one element is "directly coupled" or "directly connected" to another element can be interpreted to mean that still another element does not exist between the one element and the another element.

Also, in the disclosure, the expression 'identical' not only means that some features perfectly coincide, but also means that the features include a difference in consideration of a machining error range.

Other than the above, in describing the disclosure, in case it is determined that detailed explanation of related known functions or features may unnecessarily confuse the gist of the disclosure, the detailed explanation will be abridged or omitted.

According to one or more embodiments of the disclosure, a display module may include a substrate, and a plurality of light emitting diodes for displaying an image arranged on the substrate.

According to one or more embodiments of the disclosure, the light emitting diodes included in the display module may be inorganic light emitting diodes having a size of 100 μm or smaller. For example, inorganic light emitting diodes may be micro LEDs or mini LEDs, but are not limited thereto. Inorganic light emitting diodes have better brightness and light emitting efficiency, and a longer lifespan than organic light emitting diodes (referred to as 'OLEDs' hereinafter). Inorganic light emitting diodes may be semiconductor chips that can emit light by themselves in case power is supplied. Inorganic light emitting diodes have fast reaction speed, low power consumption, and high luminance. In case inorganic light emitting diodes are micro LEDs, they may have higher efficiency in converting electricity into photons than LCDs or OLEDs. For example, micro LEDs may have higher "brightness per watt" compared to an LCD or OLED display. Accordingly, micro LEDs can exert identical brightness with about half the energy compared to LEDs or OLEDs exceeding 100 μm. Also, micro LEDs can implement a high resolution, and excellent colors, contrast, and brightness, and thus they can express colors in a wide range correctly, and can implement a clear screen in the outdoors brighter than the indoors. In addition, micro LEDs are strong against a burn-in phenomenon and generate little heat, and thus a long lifespan without distortion can be guaranteed.

According to one or more embodiments of the disclosure, on the substrate, a TFT layer on which a thin film transistor (TFT) circuit is formed may be arranged on a first surface (e.g., the front surface of the substrate). On the substrate, a power supply circuit supplying power to the TFT circuit and a data driving driver, a gate driving driver, and a timing controller controlling each driving driver may be arranged on a second surface (e.g., the rear surface of the substrate). Also, on the substrate, a plurality of pixels may be arranged on the TFT layer. Each pixel may be driven by the TFT circuit.

According to one or more embodiments of the disclosure, the TFTs formed on the TFT layer may be low-temperature polycrystalline silicon (LTPS) TFTs, low-temperature polycrystalline oxide (LTPO) TFTs, or oxide TFTs.

According to one or more embodiments of the disclosure, the substrate on which the TFT layer is provided may be a glass substrate, a substrate based on a synthetic resin having flexibility (e.g., polyimide (PI), polyethylene terephthalate (PET), polyethersulfone (PES), polyethylene naphthalate (PEN), polycarbonate (PC), etc.), or a ceramic substrate.

According to one or more embodiments of the disclosure, the TFT layer of the substrate may be formed integrally with the first surface of the substrate, or manufactured in a form of a separate film, and attached on the first surface of the substrate.

According to one or more embodiments of the disclosure, the first surface of the substrate may be divided into an active area and an inactive area. The active area may be an area occupied by the TFT layer in the entire area of the first surface of the substrate. The inactive area may be an area excluding the active area in the entire area of the first surface of the substrate.

According to one or more embodiments of the disclosure, the edge area of the substrate may be the outermost area of the substrate. For example, the edge area of the substrate may include an area corresponding to the side surface of the substrate, some areas of the first surface of the substrate respectively adjacent to the side surface, and some areas of the second surface of the substrate. In the edge area of the substrate, a plurality of side surface wirings that electronically connect the TFT circuit existing on the first surface of the substrate and the driving circuit existing on the second surface of the substrate may be arranged.

According to one or more embodiments of the disclosure, the substrate may be formed as a quadrangle type. For example, the substrate may be formed as a rectangle or a square.

According to one or more embodiments of the disclosure, the TFTs provided on the substrate may be implemented as, for example, oxide TFTs and Si TFTs (polysilicon, a-silicon), organic TFTs, graphene TFTs, etc. other than low-temperature polycrystalline silicon (LTPS) TFTs. For the TFTs, only P-type (or N-type) MOSFETs may be made in an Si wafer CMOS process and applied.

According to one or more embodiments of the disclosure, in the substrate, the TFT layer on which a TFT circuit is formed may be omitted. In this case, a plurality of micro IC chips functioning as a TFT circuit may be mounted on the front surface of the substrate. In this case, the plurality of micro ICs may be electronically connected to the plurality of light emitting diodes arranged on the first surface of the substrate through the wirings.

According to one or more embodiments of the disclosure, the pixel driving method of the display module may be an active matrix (AM) driving method or a passive matrix (PM) driving method.

According to one or more embodiments of the disclosure, the display module may be installed and applied to a wearable device, a portable device, a handheld device, and various kinds of electronic components or electronic parts needing displays.

According to one or more embodiments of the disclosure, a plurality of display modules may be connected in a grid arrangement, and display devices such as a monitor for a personal computer, a high resolution television and signage (or, digital signage), an electronic display, etc. may be formed.

According to one or more embodiments of the disclosure, one pixel may include a plurality of light emitting diodes. In this case, one light emitting diode may be a sub-pixel. In the disclosure, one 'light emitting diode,' one 'light emitting element', one 'micro LED,' and one 'sub-pixel' may be interchangeably used as the same meaning.

Hereinafter, the embodiments of the disclosure will be described in detail with reference to the accompanying drawings, such that those having ordinary skill in the art to which the disclosure belongs can easily carry out the disclosure. However, it should be noted that the disclosure may be implemented in various different forms, and is not limited to the embodiments described herein. Also, in the drawings, parts that are not related to explanation were omitted, for explaining the embodiments of the disclosure clearly, and throughout the specification, similar parts were designated by similar reference numerals.

Hereinafter, the display device according to one or more embodiments of the disclosure will be described with reference to the drawings.

FIG. 1 is a block diagram illustrating a display device according to one or more embodiments of the disclosure.

Referring to FIG. 1, the display device 1 according to one or more embodiments of the disclosure may include a display module 3 and a processor 5.

The display module 3 may display various images. Here, an image is a concept including a still image and/or a moving image. The display module 3 may display various images such as a broadcasting content, a multimedia content, etc. Also, the display module 3 may display a user interface and icons.

The display module 3 may include a substrate 40 and a display driver integrated circuit (IC) 7 for controlling the substrate 40.

The display driver IC 7 may include an interface module 7*a*, a memory 7*b* (e.g.: a buffer memory), an image processing module 7*c*, or a mapping module 7*d*. The display driver IC 7 may, for example, receive image data, or image information including an image control signal corresponding to a command for controlling the image data from other components of the display device 1 through the interface module 7*a*. For example, the image information may be received from the processor 5 (e.g.: a main processor (e.g.: an application processor)) or a subsidiary processor (e.g.: a graphic processing device) that is independently operated from the function of the main processor.

The display driver IC 7 may store at least some of the received image information in the memory 7*b* in, for example, frame units. The image processing module 7*c* may, for example, perform pre-processing or post-processing (e.g.: adjustment of the resolution, the brightness, or the size) of at least some of the image data based on the characteristic of the image data or the characteristic of the substrate 40. The mapping module 7*d* may generate a voltage value or a current value corresponding to the image data pre-processed or post-processed through the image processing module 7*c*. According to one or more embodiments of the disclosure, generation of a voltage value or a current value may be performed, for example, based at least partially on the attributes of the pixels arranged on the substrate 40 (e.g.: the arrangement of the pixels such as an RGB stripe structure or an RGB gentile structure or the sizes of each sub-pixel). At least some pixels of the substrate 40 may be driven, for example, based at least partially on the voltage value or the current value, and accordingly, visual information (e.g.: texts, images, or icons) corresponding to the image data may be displayed through the substrate 40.

The display driver IC 7 may transmit a driving signal (e.g.: a driver driving signal, a gate driving signal, etc.) to the display based on the image information received from the processor 5.

The display driver IC 7 may display an image based on an image signal received from the processor 5. As an example, the display driver IC 7 may generate a driving signal of the plurality of sub-pixels based on the image signal received from the processor 5, and display an image by controlling light emission of the plurality of sub-pixels based on the driving signal.

The display module 3 may further include a touch circuit (not shown). The touch circuit may include a touch sensor and a touch sensor IC for controlling the touch sensor. The touch sensor IC may, for example, control the touch sensor for detecting a touch input or a hovering input for a designated location of the substrate 40. For example, the touch sensor IC may detect a touch input or a hovering input by measuring a change of a signal (e.g.: the voltage, the light amount, the resistance, or the charge amount) of a signal for the designated location of the substrate 40. The touch sensor IC may provide information regarding the detected touch input or hovering input (e.g.: the location, the area, the pressure, or the time) to the processor 5. According to one or more embodiments of the disclosure, at least a part of the touch circuit (e.g.: the touch sensor IC) may be included as a part of the display driver IC 7 or the substrate 40, or as a part of another component (e.g.: a subsidiary processor) arranged outside the display module 3.

The processor 5 may be implemented as a digital signal processor (DSP) processing digital image signals, a microprocessor, a graphics processing unit (GPU), an artificial intelligence (AI) processor, a neural processing unit (NPU), and a time controller (TCON). However, the disclosure is not limited thereto, and the processor 5 may include one or more of a central processing unit (CPU), a micro controller unit (MCU), a micro processing unit (MPU), a controller, an application processor (AP), or a communication processor (CP), and an ARM processor, or may be defined by the terms. Also, the processor 5 may be implemented as a system on chip (SoC) having a processing algorithm stored therein or large scale integration (LSI), or in the form of an application specific integrated circuit (ASIC) or a field programmable gate array (FPGA).

The processor 5 may drive an operating system or an application program and thereby control hardware or software components connected to the processor 5, and perform various kinds of data processing and operations. Also, the processor 5 may load commands or data received from at least one of the other components on a volatile memory and process them, and store various kinds of data in a non-volatile memory.

The display module 3 may be a touch screen combined with a touch sensor, a flexible display, a rollable display, and/or a three dimension display.

Figure 2:
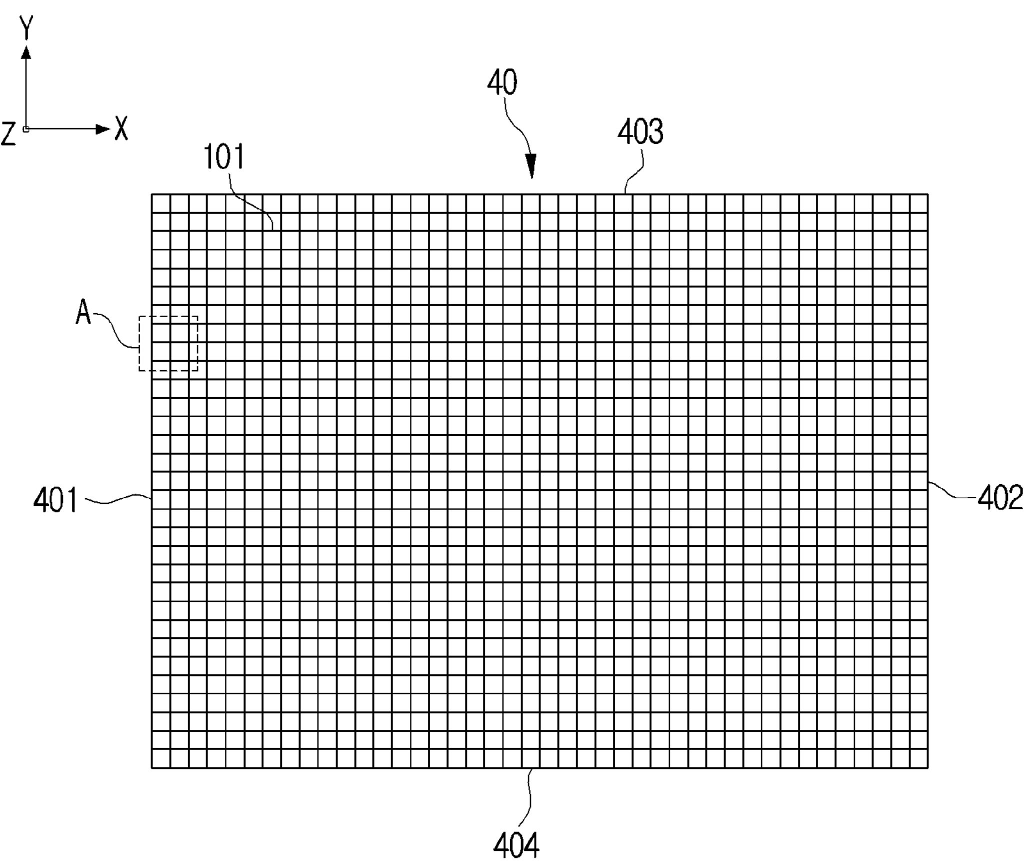
FIG. 2 is a plan view illustrating a display module according to one or more embodiments of the disclosure.
Figure 3:
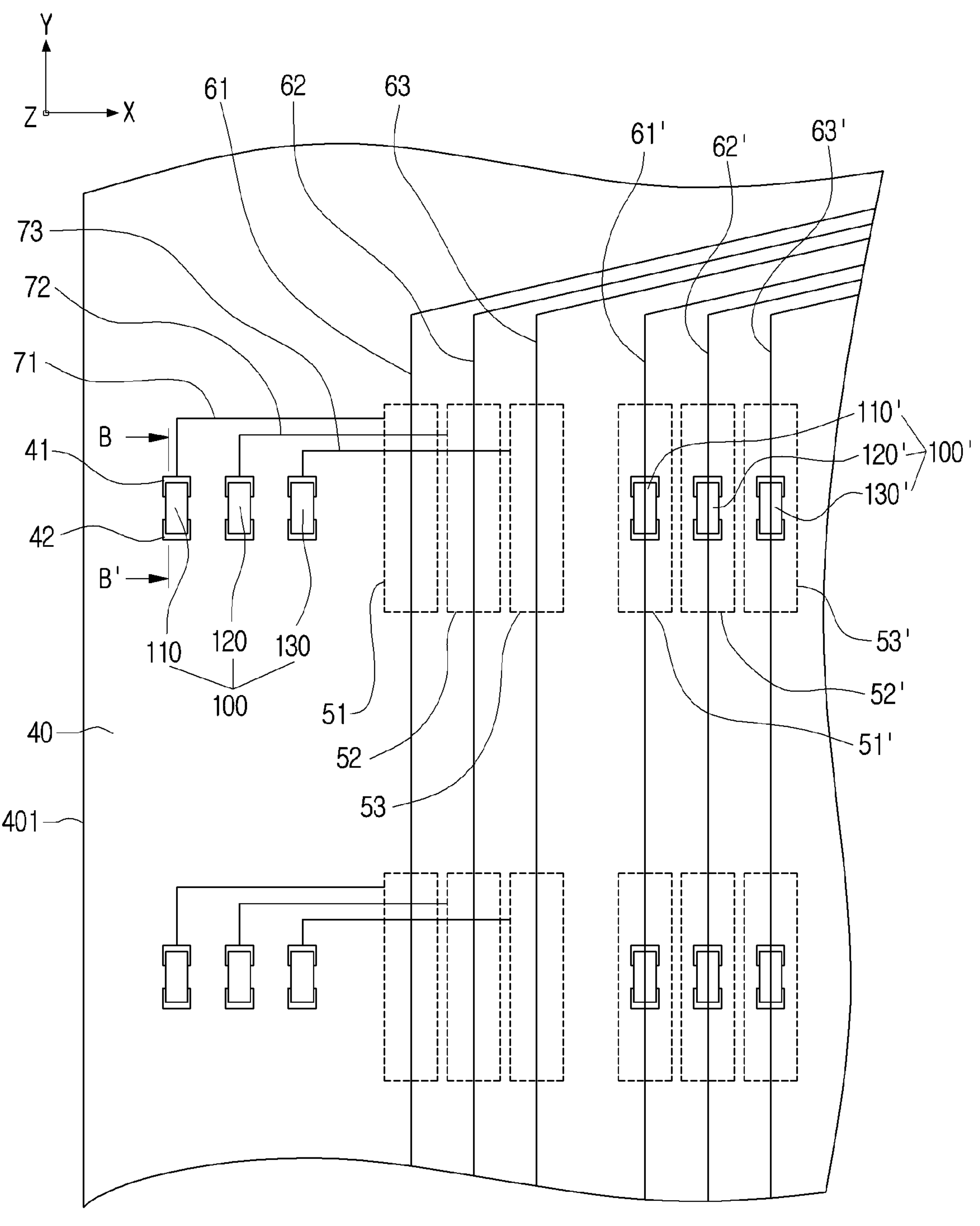
FIG. 3 is a diagram that enlarged the A portion displayed in FIG. 2.
Figure 4:
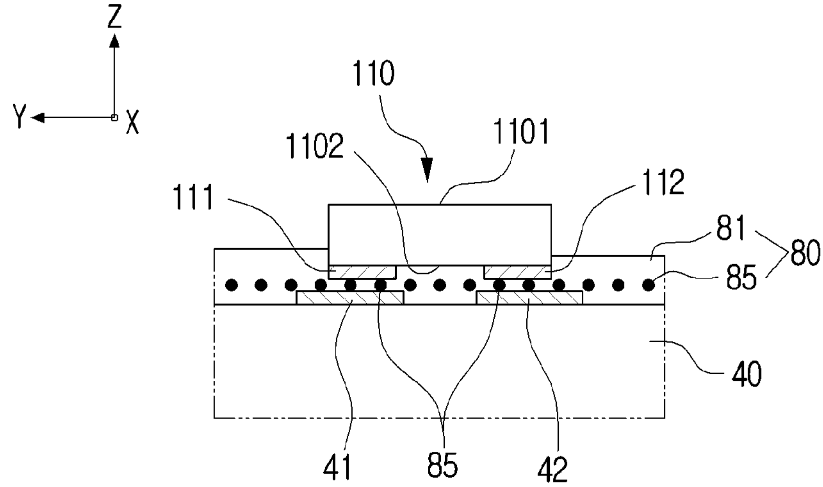
FIG. 4 is a cross-sectional diagram illustrated along the B-B' line displayed in FIG. 3.

FIG. 2 is a plan view illustrating a display module according to one or more embodiments of the disclosure. FIG. 3 is a diagram that enlarged a portion of a display module (the A portion displayed in FIG. 2) according to one or more embodiments of the disclosure. FIG. 4 is a diagram illustrating a cross-section of a portion of a display module (e.g.: a schematic cross-section illustrated along the B-B' line displayed in FIG. 3) according to one or more embodiments of the disclosure.

Referring to FIG. 2 and FIG. 3, the display module 3 may include the substrate 40, and a plurality of pixels 100 provided on the first surface of the substrate 40. For example, the plurality of pixels 100 may be respectively arranged in a pixel area 101 arranged in a matrix form on the substrate 40. The pixel area 101 may be an area partitioned logically, but not an area partitioned physically.

On the substrate 40, a thin film transistor (TFT) circuit electronically connected with the plurality of pixels 100 may be provided on the first surface. The TFTs provided on the substrate 40 may be amorphous silicon (a-Si) TFTs, low temperature polycrystalline silicon (LTPS) TFTs, low temperature polycrystalline oxide (LTPO) TFTs, hybrid oxide and polycrystalline silicon (HOP) TFTs, liquid crystalline polymer (LCP) TFTs, or organic TFTs (OTFTs).

Referring to FIG. 3, each of the plurality of pixels 100 may include at least three sub-pixels. The sub-pixels may be, for example, micro LEDs which are inorganic light emitting diodes. Hereinafter, a sub-pixel will be referred to as a micro LED, for the convenience of explanation. Here, a micro LED may be defined as an LED of which size is 100 μm or smaller or 30 μm or smaller.

Each pixel 100 may include a first micro LED 110 emitting a light of a red wavelength band, a second micro LED 120 emitting a light of a green wavelength band, and a third micro LED 130 emitting a light of a blue wavelength band. For example, inside one pixel area 101, one pixel 100 may be arranged. Among the pixel areas, in the area not occupied by the first, second, and third micro LEDs 110, 120, 130, a plurality of TFTs for respectively driving the first, second, and third micro LEDs 110, 120, 130 may be arranged.

The first, second, and third micro LEDs 110, 120, 130 may be arranged in a row at a specific interval, but the disclosure is not limited thereto. For example, the first, second, and third micro LEDs 110, 120, 130 may be arranged in the form of the character L, or arranged by a pentile RGBG method. The pentile RGBG method is a method of spatially arranging the numbers of the sub-pixels in red, green, and blue colors in the ratio of 1:1:2 (R:G:B) by using the recognition characteristic that a human identifies a green color better than a blue color. The pentile RGBG method can improve the yield and reduce the unit cost. Also, the pentile RGBG method can implement a high resolution in a small screen.

It was described that the one pixel 100 includes three micro LEDs (e.g.: the first, second, and third micro LEDs 110, 120, 130), but the disclosure is not limited thereto. For example, the one pixel 100 may include one micro LED, or include four or more micro LEDs (e.g.: red, green, blue, and white micro LEDs).

Referring to FIG. 4, a micro LED may consist of a flip chip form wherein a first electrode 111 and a second electrode 112 are arranged on the opposite surface 1102 of the light emitting surface 1101. For example, the first electrode 111 may be an anode electrode, and the second electrode 112 may be a cathode electrode.

On one surface of the substrate, a plurality of substrate electrode pads 41, 42 may be arranged in a pair at an interval. The plurality of substrate electrode pads 41, 42 may respectively be connected electronically to the first electrode 111 and the second electrode 112 of the first micro LED 110.

On one surface of the substrate 40, a bonding member 80 may be laminated before the first, second, and third micro LEDs 110, 120, 130 are transferred to the substrate. The bonding member 80 may be, for example, an anisotropic conductive film (ACF) or an anisotropic conductive paste (ACP).

The bonding member 80 may include an adhesive layer 81 and a plurality of conductive balls 85 having fine sizes that are included in the adhesive layer 81. The adhesive layer 81 may be a resin consisting of a thermosetting material (e.g.: an epoxy resin, a polyurethane or acryl resin). The plurality of conductive balls 85 have fine sizes (e.g.: about 3 μm to 15 μm), and may include polymer particles and a conductive film (e.g.: gold (Au), nickel (Ni), or lead (pd)) coated in a specific thickness on the outer circumferential surface of the polymer particles.

After the first micro LED 110 is transferred to the substrate 40, it may be thermo-compressed. In this case, the first electrode 111 and the second electrode 112 of the first micro LED 110 may be respectively connected electronically to the corresponding substrate electrode pads 41, 42 through the plurality of conductive balls 85. The first micro LED 110 may be physically fixed to the substrate 40 robustly by the adhesion layer 81 that is cured after thermo-compression. The second and third micro LEDs 120, 130 may also be electronically and physically connected to the substrate 40 through the bonding member 80 in the same manner as the aforementioned first micro LED 110.

On the substrate 40, a plurality of pixel circuits for driving the plurality of micro LEDs may be provided. One micro LED may be driven by one pixel circuit. In one pixel circuit, a plurality of TFTs and a capacitor, etc. may be included.

For example, the first micro LED 110 may be driven by the first pixel circuit 51. In this case, the first electrode 111 of the first micro LED 110 may be electronically connected to the first pixel circuit 51 by the first connection wiring 71. Also, the second micro LED 120 may be electronically connected to the second pixel circuit 52 by the second connection wiring 72. The third micro LED 130 may be electronically connected to the third pixel circuit 53 by the third connection wiring 73.

The first, second, and third pixel circuits 51, 52, 53 may be respectively connected electronically to the corresponding data wirings 61, 62, 63. The fourth, fifth, and sixth pixel circuits 51', 52', 53' adjacent to the right sides of the first, second, and third pixel circuits 51, 52, 53 may also be respectively connected electronically to the corresponding data wirings 61', 62', 63'. For example, the data wirings (61, 62, 63, 61', 62', 63') may be arranged along the vertical direction of the substrate 40 as in FIG. 3.

In the display module 3, the pixel 100 adjacent to the left edge 401, the right edge 402, the upper edge 403, and the lower edge 404 of the substrate 40 among the plurality of micro LEDs arranged on the substrate 40 is exposed to an external shock easily during the manufacturing process. In case an external shock is applied to the left, right, upper, and lower edges 401, 402, 403, 404 of the display module 3, the TFT layer adjacent to the left, right, upper, and lower edges 401, 402, 403, 404 may be damaged. Due to the damage to the TFT layer, the first, second, and third pixel circuits 51, 52, 53 may be damaged, and the data wirings 71, 72, 73 having narrow widths that are electronically connected to the first, second, and third pixel circuits 51, 52, 53 may be easily disconnected. The data wirings 71, 72, 73 may be signal lines having long signal paths. In case the data wirings 71, 72, 73 are disconnected, an image noise may be generated in the display module 3.

For improving such a problem, in one or more embodiments according to the disclosure, the first, second, and third pixel circuits 51, 52, 53 for driving the pixel 100 (the first, second, and third micro LEDs 110, 120, 130) adjacent to the left edge 401 of the substrate 40 may be arranged to be farther from the left edge 401 than the pixel 100 of the substrate 40. The data wirings 71, 72, 73 having narrow widths that are electronically connected to the first, second, and third pixel circuits 51, 52, 53 may be arranged to correspond to the locations of the first, second, and third pixel circuits 51, 52, 53. Accordingly, the data wirings 71, 72, 73 may be arranged to be farther from the left edge 401 than the pixel 100 of the substrate 40 in an identical or similar manner to the first, second, and third pixel circuits 51, 52, 53.

As described above, the first, second, and third pixel circuits 51, 52, 53 and the data wirings 71, 72, 73 may be located more to the inside of the substrate 40 (or the right side of the substrate 40) than the locations of a pair of substrate electrode pads to which the third micro LED 130 is connected. Accordingly, damage to the first, second and third pixel circuits 51, 52, 53 and disconnection of the data wirings 71, 72, 73 corresponding thereto due to a shock applied to the left edge of the display module 3 during the manufacturing process can be prevented or minimized.

According to one or more embodiments of the disclosure, the plurality of pixel circuits adjacent to the right edge 402 of the substrate 40 and the data wirings that are respectively connected electronically to the plurality of pixel circuits may be arranged in farther locations to the left side of the substrate 40 from the right edge 402 of the substrate than the location of the substrate electrode pad adjacent to the right edge 402 of the substrate. Also, according to one or more embodiments of the disclosure, the plurality of pixel circuits adjacent to the upper edge 403 of the substrate 40 and the data wirings that are respectively connected electronically to the plurality of pixel circuits may be arranged in farther locations to the lower side of the substrate 40 from the upper edge 403 of the substrate than the location of the substrate electrode pad adjacent to the upper edge 403 of the substrate. Further, according to one or more embodiments of the disclosure, the plurality of pixel circuits adjacent to the lower edge 404 of the substrate 40 and the data wirings that are respectively connected electronically to the plurality of pixel circuits may be arranged in farther locations to the upper side of the substrate 40 from the lower edge 404 of the substrate than the location of the substrate electrode pad adjacent to the lower edge 404 of the substrate.

Referring to FIG. 3, the fourth, fifth, and sixth pixel circuits 51', 52', 53' for driving another pixel 100' (e.g.: the fourth, fifth, and sixth micro LEDs 110', 120', 130') may be arranged in locations corresponding to the substrate electrode pads to which the fourth, fifth, and sixth micro LEDs 110', 120', 130' are connected. However, the disclosure is not limited thereto, and the fourth, fifth, and sixth pixel circuits 51', 52', 53' may be arranged farther to the right side of the substrate 40 from the left edge 401 of the substrate 40 than the locations of the substrate electrode pads to which the fourth, fifth, and sixth micro LEDs 110', 120', 130' are connected.

Figure 5:
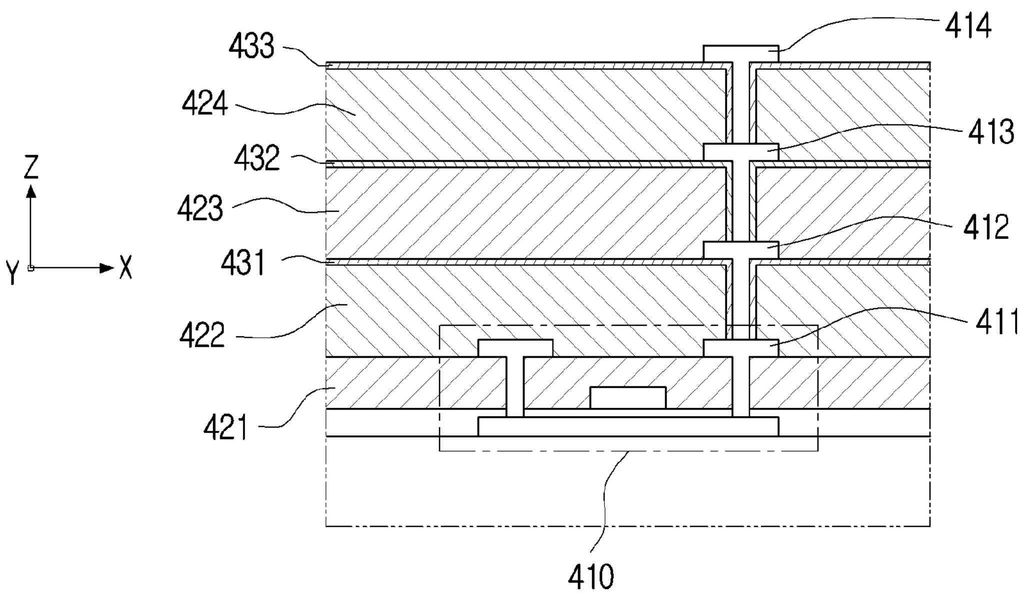
FIG. 5 is a schematic cross-sectional diagram illustrating multilayers of a display module according to one or more embodiments of the disclosure.

FIG. 5 is a schematic cross-sectional diagram illustrating multilayers of a display module according to one or more embodiments of the disclosure.

Referring to FIG. 5, on the substrate 40, a TFT layer on which pixel circuits 51, 52, 53, 51', 52', 53' (refer to FIG. 3) are formed may be provided. The TFT layer may be formed in multilayers on one surface of the substrate 40. For example, the TFT layer may include a TFT 410, and first, second, third, and fourth insulating layers 421, 422, 423, 424. In this case, the TFT 410 may consist of a plurality of TFTs.

The TFT layer may include passivation layers 431, 432, 433 respectively arranged between the second insulating layer 422 and the third insulating layer 423, between the third insulating layer 423 and the fourth insulating layer 424, and on the upper surface of the fourth insulating layer 424.

The TFT layer may include first, second, third, and fourth metal wirings 411, 412, 413, 414 arranged on different layers.

According to one or more embodiments of the disclosure, for the data wirings 61, 62, 63, 61', 62', 63' (refer to FIG. 3), the first metal wiring 411 or the second metal wiring 412 may be used. In this case, for the connection wirings 71, 72, 73, 71', 72', 73' (refer to FIG. 3), the third metal wiring 413 or the fourth metal wiring 414 may be used. Accordingly, an image noise generated due to coupling between the data wirings 61, 62, 63, 61', 62', 63' and the connection wirings 71, 72, 73, 71', 72', 73' can be minimized.

Figure 6:
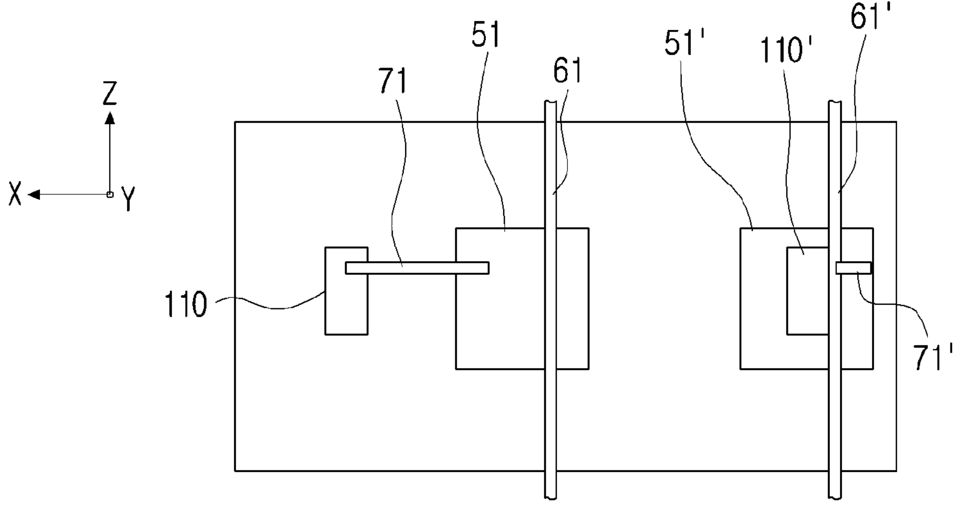
FIG. 6 illustrates an enlarged view of the portion A of FIG. 2, according to some exemplary embodiments.

FIG. 6 illustrates a magnified view of the portion A of FIG. 2. Similarly to FIG. 3, a first pixel circuit 51 is toward the left edge 401. The sub-pixel 110 is connected to the first pixel circuit 51 by the connection wiring 71. The first pixel circuit 51 is controlled by the display driver IC 7 via the data wiring 61. Neighboring the first pixel circuit 51 to the right is a second pixel circuit 51'. A connection of the second pixel circuit 51' to a sub-pixel 110' is schematically illustrated as a connection wiring 71'. The light emitting elements may be uniformly disposed over the surface of the substrate 40 in an x-y plane. The x direction may be referred to as a first dimension, the y direction may be referred to as a second dimension, and the z direction may be referred to as a third dimension.

Figure 7:
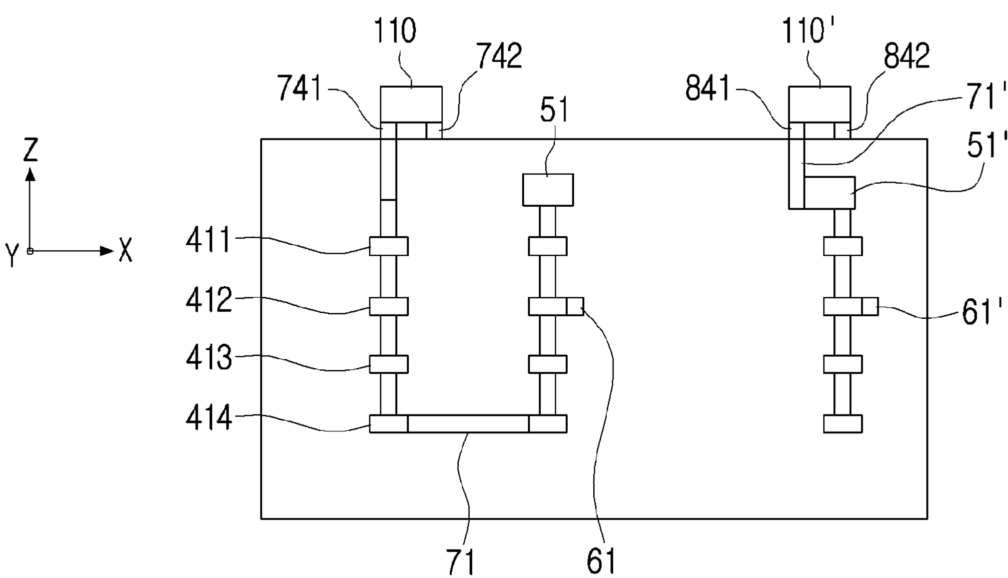
FIG. 7 illustrates an elevation view the enlarged view of FIG. 6, according to some exemplary embodiments.

FIG. 7 is an elevation view to complement the magnified plan view of FIG. 6. Similarly to FIG. 5, instances of metal wirings 414, 413, 412 and 411 are shown as a stack of metal wirings. The first pixel circuit 51 is located inwardly from edge 401 of substrate 40 compared to the first sub-pixel 110. The second pixel circuit 51' and the second sub-pixel 110' are located at approximately the same location.

The plurality of light emitting elements may be arranged uniformly over a surface of the substrate 40, see FIG. 2.

In some embodiments, the first edge (401) is susceptible to a physical shock during a manufacturing process, and the first pixel circuit (51) being further from the first edge of the substrate than is the first light emitting element (110), is configured to reduce a damage due to the physical shock. For example, data wiring 61 is then corresponding further from the edge 401 among the pixel elements, and is less likely to be broken by such a physical shock at the edge 401.

In some embodiments, the first light emitting element (110), the first pixel circuit (51), the second pixel circuit (51') and the second light emitting element (110') are located on the surface defined by the first direction (x direction) and the second direction (y direction) at a first location, a second location, a third location and the third location, respectively, wherein the first edge (401) extends in the second direction (y direction), and wherein the first pixel circuit (51) is located at the second location inwardly along the first direction (x direction) from the first location.

In some embodiments, the display module includes a display driver integrated circuit (IC) (7), each layer of the plurality of layers extends in the first direction (x direction) and the second direction (y direction), the plurality of layers are stacked in a third direction (z direction), the second pixel circuit (51') and the second light emitting element (110') are electrically connected to the display driver IC (7) by a third instance of metal wirings stacked in the third direction and a third connection wiring (61), the first pixel circuit (51) is electrically connected to the display driver IC (7) by a first instance of metal wirings stacked in the third direction and a first connection wiring (61), and the first light emitting element (110) is connected to the first pixel circuit (51) by a third instance of metal wiring stacked in the third direction and a second connection wiring (71).

In some embodiments, the first connection wiring and the second connection wiring are not in the same layer of the plurality of layers. See elements 61 and 71 in FIG. 7B.

In some embodiments, the first connection wiring and the third connection wiring are in the same layer of the plurality of layers. See elements 61 and 61' in FIG. 7B.

In some embodiments, the number of layers is four. See FIGS. 5 and 7B.

In some embodiments, the first light emitting element includes three subpixels, wherein the three subpixels correspond respectively to the colors red, green and blue.

In some embodiments, the first light emitting element includes four subpixels, wherein the four subpixels correspond respectively to the colors red, green, blue and green.

In some embodiments, the three subpixels includes a first subpixel, the first subpixel is configured as a microLED, and the dimensions of the microLED are approximately 35 micrometers by 25 micrometers.

In some embodiments, the first edge (401) extends in the second direction (y direction), a distance from the first light emitting element (110) to the first pixel circuit (51) is approximately 100 micrometers measured along the first direction (x direction), and the second light emitting element (110') and the second pixel circuit (51') are located within 10 micrometers of each other measured along the first direction (x direction).

In the above description, the disclosure was explained by an exemplary method. However, it should be noted that the terms used herein are for explaining the disclosure, and the terms are not to be interpreted to limit the disclosure. Also, various amendments and modifications of the disclosure may be made according to the above content. Accordingly, the disclosure may be implemented freely within the scope of the appended claims, unless there is no additional mention in that regard.

What is claimed is:

1. A display module comprising:

a substrate on which a plurality of substrate electrode pads are arranged and which includes a plurality of pixel circuits connected with the plurality of substrate electrode pads, wherein the plurality of pixel circuits comprises a first pixel circuit and a second pixel circuit, and wherein the plurality of substrate electrode pads comprises a first substrate electrode pad; and a plurality of light emitting elements connected to the plurality of substrate electrode pads, the plurality of light emitting elements comprising a first light emitting element, wherein the first light emitting element is electrically connected to the first substrate electrode pad and the first pixel circuit is configured to control the first light emitting element, wherein the first pixel circuit is closer to a first edge of the substrate than the second pixel circuit, and the first pixel circuit is farther from the first edge of the substrate than is the first light emitting element.

2. The display module of claim 1, wherein the substrate comprises:

a plurality of data wirings that are respectively connected electrically to the first pixel circuit, and wherein the plurality of data wirings are arranged to be farther from the first edge of the substrate than the first light emitting element.

3. The display module claim 1, wherein the substrate is a quadrangle comprising the first edge, a second edge, a third edge and a fourth edge.

4. The display module of claim 1, wherein the substrate comprises the first edge and a second edge, wherein the second edge is opposite to the first edge, and wherein the plurality of pixel circuits are arranged to be closer to the second edge than the first light emitting element.

5. The display module of claim 2, wherein the plurality of substrate electrode pads are respectively electrically connected to corresponding pixel circuits through a plurality of connection wirings.

6. The display module of claim 5, wherein the substrate comprises a plurality of layers, and wherein the plurality of data wirings and the plurality of connection wirings are arranged on different layers of the plurality of layers.

7. The display module of claim 6, wherein the second pixel circuit is configured to control a second light emitting element among the plurality of lighting elements, wherein the plurality of light emitting elements are arranged uniformly over a surface of the substrate, and the surface extends in a first direction and a second direction perpendicular to the first direction.

8. The display module of claim 7, wherein the first edge is susceptible to a physical shock during a manufacturing process, and the first pixel circuit being farther from the first edge of the substrate than is the first light emitting element, is configured to reduce a damage due to the physical shock.

9. The display module of claim 7, wherein the first light emitting element, the first pixel circuit, and the second pixel circuit and the second light emitting element are located on the surface defined by the first direction and the second direction at a first location, a second location, and a third location, respectively, wherein the first edge extends in the second direction, and wherein the first pixel circuit is located at the second location inwardly along the first direction from the first location.

10. The display module of claim 7, further comprising a display driver integrated circuit (IC), wherein each layer of the plurality of layers extends in the first direction and the second direction, the plurality of layers are stacked in a third direction, the second pixel circuit and the second light emitting element are electrically connected to the display driver IC by a third instance of metal wirings stacked in the third direction and a third connection wiring, the first pixel circuit is electrically connected to the display driver IC by a first instance of metal wirings stacked in the third direction and a first connection wiring of the plurality of connection wirings, and the first light emitting element is connected to the first pixel circuit by the third instance of metal wirings stacked in the third direction and a second connection wiring of the plurality of connection wirings.

11. The display module of claim 10, wherein the first connection wiring and the second connection wiring are not in a same layer of the plurality of layers.

12. The display module of claim 10, wherein the first connection wiring and the third connection wiring are in a same layer of the plurality of layers.

13. The display module of claim 10, wherein the plurality of layers is four.

14. The display module of claim 1, wherein the first light emitting element comprises three subpixels, wherein the three subpixels correspond respectively to colors of red, green and blue.

15. The display module of claim 1, wherein the first light emitting element comprises four subpixels, wherein the four subpixels correspond respectively to colors of red, green, blue and green.

16. The display module of claim 14, wherein the three subpixels comprise a first subpixel, the first subpixel is configured as a microLED, and dimensions of the microLED are 35 micrometers by 25 micrometers.

17. The display module of claim 7, wherein the first edge extends in the second direction, a distance from the first light emitting element to the first pixel circuit is 100 micrometers measured along the first direction, and the second light emitting element and the second pixel circuit are located within 10 micrometers of each other measured along the first direction.

* * * * *